(12) United States Patent
Vesma et al.

(10) Patent No.: US 7,877,663 B2
(45) Date of Patent: Jan. 25, 2011

(54) FORWARD ERROR CORRECTION DECODERS

(75) Inventors: Jussi Vesma, Turku (FI); Harri Pekonen, Raisio (FI)

(73) Assignee: Nokia Corporation, Espoo (FI)

( * ) Notice: Subject to any disclaimer, the term of this patent is extended or adjusted under 35 U.S.C. 154(b) by 932 days.

(21) Appl. No.: 10/578,424

(22) PCT Filed: Oct. 26, 2004

(86) PCT No.: PCT/IB2004/052205

§ 371 (c)(1),
(2), (4) Date: May 7, 2007

(87) PCT Pub. No.: WO2005/046247

PCT Pub. Date: May 19, 2005

(65) Prior Publication Data

US 2007/0266294 A1    Nov. 15, 2007

(30) Foreign Application Priority Data

Nov. 5, 2003    (GB) ................................ 0325843.1

(51) Int. Cl.
*H03M 13/00* (2006.01)
(52) U.S. Cl. ...................... 714/758; 714/703; 714/799; 714/801; 714/784; 702/189
(58) Field of Classification Search ................ 714/703, 714/758, 784, 799, 801; 702/189
See application file for complete search history.

(56) References Cited

U.S. PATENT DOCUMENTS 5,121,395 A   6/1992  Millar ........................ 371/39.1
5,278,846 A * 1/1994  Okayama et al. ............ 714/755
5,517,509 A * 5/1996  Yoneda ........................ 714/785

(Continued)

FOREIGN PATENT DOCUMENTS

EP    0 756 385 A2    1/1997

(Continued)

*Primary Examiner*—Guy J Lamarre
(74) *Attorney, Agent, or Firm*—Harrington & Smith

(57) ABSTRACT

Elements of a coding table which are error-free are found at S2. At S3, corresponding elements in an erasure information table are completed, indicating that the elements in the coding array are correct. A counter is initialized at Nmax, which is the maximum number of errors that can be corrected, at S4. At S5, the row of the erasure information table is scanned beginning from the first parity column for empty elements. Each empty parity date element of the erasure information table row is marked as incorrect at S7 For each such element, the counter is decremented at S8. At S9, the elements of the erasure information table are scanned from the first column of the application data and zero padding section for empty elements. At step S11, an empty element is marked as incorrect. At step S12, the counter is then decremented. It is determined at step S13 whether or not the counter is equal to zero. When the counter becomes is equal to zero, operation proceeds to step S14 where the decoder operates to fill remaining empty elements in the erasure information row as correct. Thus, whilst the count of incorrect elements for the row has not exceeded a maximum and whilst empty elements remain, empty elements of the erasure table row are marked as incorrect beginning with parity data elements and then continuing from the application data end.

12 Claims, 7 Drawing Sheets

U.S. PATENT DOCUMENTS

| | | | | |
|---|---|---|---|---|
| 5,608,740 | A | * | 3/1997 | Watanabe .................... 714/755 |
| 5,771,244 | A | | 6/1998 | Reed et al. ................ 371/37.01 |
| 5,781,565 | A | * | 7/1998 | Sako et al. .................. 714/755 |
| 6,553,536 | B1 | | 4/2003 | Hassner et al. .............. 714/780 |
| 6,598,200 | B1 | | 7/2003 | Greenwood et al. ......... 714/774 |
| 2003/0106008 | A1 | | 6/2003 | Butler et al. ................. 714/752 |
| 2003/0145274 | A1 | * | 7/2003 | Hwang et al. ............... 714/799 |

FOREIGN PATENT DOCUMENTS

| | | |
|---|---|---|
| EP | 0 844 758 A2 | 5/1998 |

* cited by examiner

| K= | 1 | 2 | 3 | 4 | 5 | 6 | 7 | 8 | 9 | 10 | 11 | 12 | 13 | 14 | 15 | 16 | 17 | 18 | 19 | 20 |
|----|---|---|---|---|---|---|---|---|---|----|----|----|----|----|----|----|----|----|----|----|
| | D | | | D | | D | | D | D | | | | | | | D | D | | | D |
| | 0 | 1 | 1 | 0 | 1 | 0 | 1 | 0 | 0 | 1 | 1 | 1 | 1 | 0 | 0 | 0 | 0 | 1 | 1 | 0 |

Figure 13

| K= | 1 | 2 | 3 | 4 | 5 | 6 | 7 | 8 | 9 | 10 | 11 | 12 | 13 | 14 | 15 | 16 | 17 | 18 | 19 | 20 |
|----|---|---|---|---|---|---|---|---|---|----|----|----|----|----|----|----|----|----|----|----|
| | D | | | D | | D | | D | D | | | | | | | D | D | | | D |
| | 0 | 1 | 1 | 0 | 1 | 0 | 1 | 0 | 0 | 0 | 0 | 0 | 0 | 0 | 0 | 0 | 0 | 1 | 1 | 0 |

FORWARD ERROR CORRECTION DECODERS

This invention relates to a method of operating a forward error correction decoder, and to a forward error correction decoder.

It is proposed to use MPE level Forward Error Correction (MPE-FEC) in the Terrestrial Digital Video-Broadcasting (DVB-T) broadcast system and in an extension of it termed DVB-H (DVB handheld). Forward error correction is convenient since it allows a receiver to correct errors in received digital data without requiring any data to be retransmitted. This is likely to be of particular importance when the receiver is included in a mobile terminal.

The MPE-FEC encoder in the transmitter side is usually placed in the IP encapsulator (IPE). The encapsulator stores data packets in a coding table or array, typically of a predetermined size. Forward error correction row data is then calculated for each row of the array, and this forms parity data. This data is then entered into a portion of the array referred to as the parity data section but can also be termed RS (Reed Solomon) data table. One example of this is illustrated in FIG. 1.

Referring to FIG. 1, an exemplary coding array 1 is illustrated comprising 1024 rows of elements by 255 columns of elements. Each element of the array stores one byte of data. A first 191 columns of elements are comprised of application data 5 and zero padding 6. The application data is made up of a number of datagrams, which are included sequentially in the table starting at the top left-hand corner and then filling up the columns in turn. In this example, a first datagram 2 is followed by a second datagram, which includes a portion 3a included in a first column, and a second portion 3b included in a second column. Similarly, a third datagram comprises a portion 4a in the second column and another portion 4b in a third column. Once all of the required datagrams have been included in the coding array, the elements which remain in the 191 columns and which have not been included with application data are zero padded, i.e. they are filled with zeros. Following the filling of the first 191 columns with application data and zero padding, the parity data is calculated.

An exemplary way to prepare the parity data is using the Reed Solomon algorithm. This is calculated for each of the 1024 rows. For each of the 191 elements of application data and zero padding in a row, 64 elements of Reed Solomon parity data are generated and are included at the end of that row. Repeating this procedure for each of the 1024 rows result in the coding array 1 being completed with either application data elements, zero padding or parity data elements. The parity data section is indicated at 7. The application datagrams are encapsulated in MPE sections and each column of RS parity data is encapsulated in MPE-FEC section. Further, MPE and MPE-FEC sections are divided into the transport stream (TS) packets for transmission. The starting address of each datagram in the table is signalled to the receiver. This allows the coding array 1 to be reproduced easily at a receiver. The zero padding is not usually transmitted.

In the example of FIG. 1, the number of rows and columns is shown consolidated for ease of understanding.

The above described FEC procedure is referred to as RS (255,191), denoting Reed Solomon 255 columns, 191 of which are application data and zero padding. The Reed Solomon FEC procedure can correct errors in 32 of the elements in a row. If erasure information is used, errors can be corrected in 64 elements in a row.

Erasure information identifies which elements in the coding array 1 reproduced at a receiver have errors in them. Thus, an erasure information table can be produced having 1024 rows by 255 columns. Although the coding array 1 has one byte of data in each element, the corresponding elements in the erasure information table includes only one bit, which is in this example a 'zero' if the element is correct or a 'one' if the element is incorrect. Information needed to determine whether the data in a received element is correct or incorrect can be obtained from a Cyclic Redundancy Check (CRC) for Internet Protocol (IP) datagrams, or for MPE datagrams, or from the DVB-T Reed Solomon decoder for Transport Stream packets. When determining whether or not an element is correct, the RS parity data 7 is treated equally to the application data elements 5. However, zero padding is always marked as correct if the location of the padding is known.

The Reed Solomon algorithm does not depend on the nature of the application data in the datagrams 2 to 4. Accordingly, this procedure is usable with multi-protocol encapsulation (MPE). This is seen to be particularly important with DVB-T, since the data may relate to audiovisual content, to audio content, or to file downloads amongst other things.

It has been proposed to identify which of the data included in the 191 columns in the coding array 1 is application data elements and which is zero padding through the use of two separate schemes. In a first proposed scheme, a one-bit field in time-slicing and FEC real-time parameters which is transmitted in the MPE or MPE-FEC header, is named as "table_boundary". This field is set to "1" for the last IP datagram in the current MPE-FEC table. If a receiver finds MPE section where the table_boundary flag is set to one, the receiver can determine the starting point of the zero padding (assuming that the CRC check indicates that the last IP datagram is correct).

The starting address of the IP datagrams is signalled in the MPE section header. Normally, the starting point of the zero padding can be calculated from the starting address and length of the last IP datagram. However, if the last IP datagram is lost during transmission or if it is received but the CRC check indicates that it is corrupted, it cannot be determined with any degree of certainty where the zero padding begins. In this case, it is necessary to treat all the zero padding as application data elements, which increases the possibility that the maximum number of allowed errors will be exceeded.

Another proposal is to include an 8-bit field named "padding_columns" in an FEC section header. This field is proposed to indicate the number of columns that include only zero padding. If a column includes both application data and zero padding, the entire column is treated as application data. Also, this field utilizes a not insignificant amount of signalling overhead.

It is an aim of the invention to provide an improved scheme suitable for use in completing an erasure table.

According to a first aspect of the invention there is provided a method of operating a forward error correction decoder, the method comprising, determining which data elements in a code word including parity data elements are error-free, marking elements in an erasure information word which correspond to error-free data elements as correct, maintaining a count of elements marked as correctable in the erasure information word; and whilst the count of elements marked as correctable has not exceeded a threshold and whilst elements not marked as correct or correctable remain in the erasure information word, marking non-marked elements of the erasure information word as correctable beginning with elements corresponding to parity data elements and then continuing for the other elements in the erasure information word.

In the described embodiments, the last marking step begins opposite and moves towards an end where zero padding may be present. Also in the embodiments, the method further comprises on determining that the count has reached the threshold and that non-marked elements remain in the erasure information word, marking non-marked elements of the erasure information word as correct. However, the skilled person may be able to derive other ways of performing the method.

This method does not require any signalling for the decoder to determine what is application data and what is zero-padding. The invention utilises the fact that the parity data can be used to correct any number of incorrect elements up to a maximum, as long as the elements which are incorrect can be identified. If the number of errors in a row is less than the maximum number of elements in a row which can be corrected, then the invention might result in some zero-padding data elements being processed as though they contained errors, whereas this would not be strictly necessary, although this would not normally increase the amount of processing, since the decoding should be done anyway and the decoding complexity does not depend on the number of errors.

According to a second aspect of the invention, there is provided a forward error correction decoder, comprising one or more processors arranged to determine which data elements in a code word including parity data elements are error-free, mark elements in an erasure information word which correspond to error-free data elements as correct, maintain a count of elements marked as correctable in the erasure information word; and mark, whilst the count of elements marked as correctable has not exceeded a threshold and whilst elements not marked as correct or correctable remain in the erasure information word, non-marked elements of the erasure information word as correctable beginning with elements corresponding to parity data elements and then continuing for the other elements in the erasure information word.

In the described embodiments, the one or more processors are arranged to mark, whilst the count of elements marked as correctable has not exceeded a threshold and whilst elements not marked as correct or correctable remain in the erasure information word, non-marked elements of the erasure information word as correctable beginning with elements corresponding to parity data elements and then continuing for the other elements in the erasure information word beginning opposite and moving towards an end where zero padding may be present. Also in the embodiments, the one or more processors are further arranged on a determination that the count has reached the threshold and that non-marked elements remain in the erasure information word, to mark non-marked elements of the erasure information word as correct. However, the skilled person may be able to derive alternative ways of constructing a decoder.

In one embodiment of the invention the one or more processors are further arranged to indicate a presence of uncorrected data in an output. This might occur where the number of incorrect elements in a row exceeds the maximum number of elements which can be corrected, and it is desirable in these circumstances for the presence of uncorrected application data to be identified.

In one embodiment of the invention the decoder is a Reed Solomon decoder having for example 255 element columns, 191 of which are non-parity data elements in one embodiment of the invention. It is envisaged that such a decoder would be particularly suitable for use with DVB-T receivers and receivers intended for operation in similar systems.

In one embodiment of the invention the decoder is included in a receiver, which could be a digital video broadcasting receiver, such as a DVB-T, DAB or ATSC receiver. Advantageously, the receiver is included in a mobile terminal.

An embodiment of the present invention will now be described, by way of example only, with reference to the accompanying drawings, of which:

FIGS. 8 to 12 show an example row of a coding array and a corresponding row of an erasure information table where appropriate, used to illustrate operation of the decoder shown in FIG. 6; and FIG. 13 shows an example row of a coding array in which fewer errors can be corrected.

Figure 1:
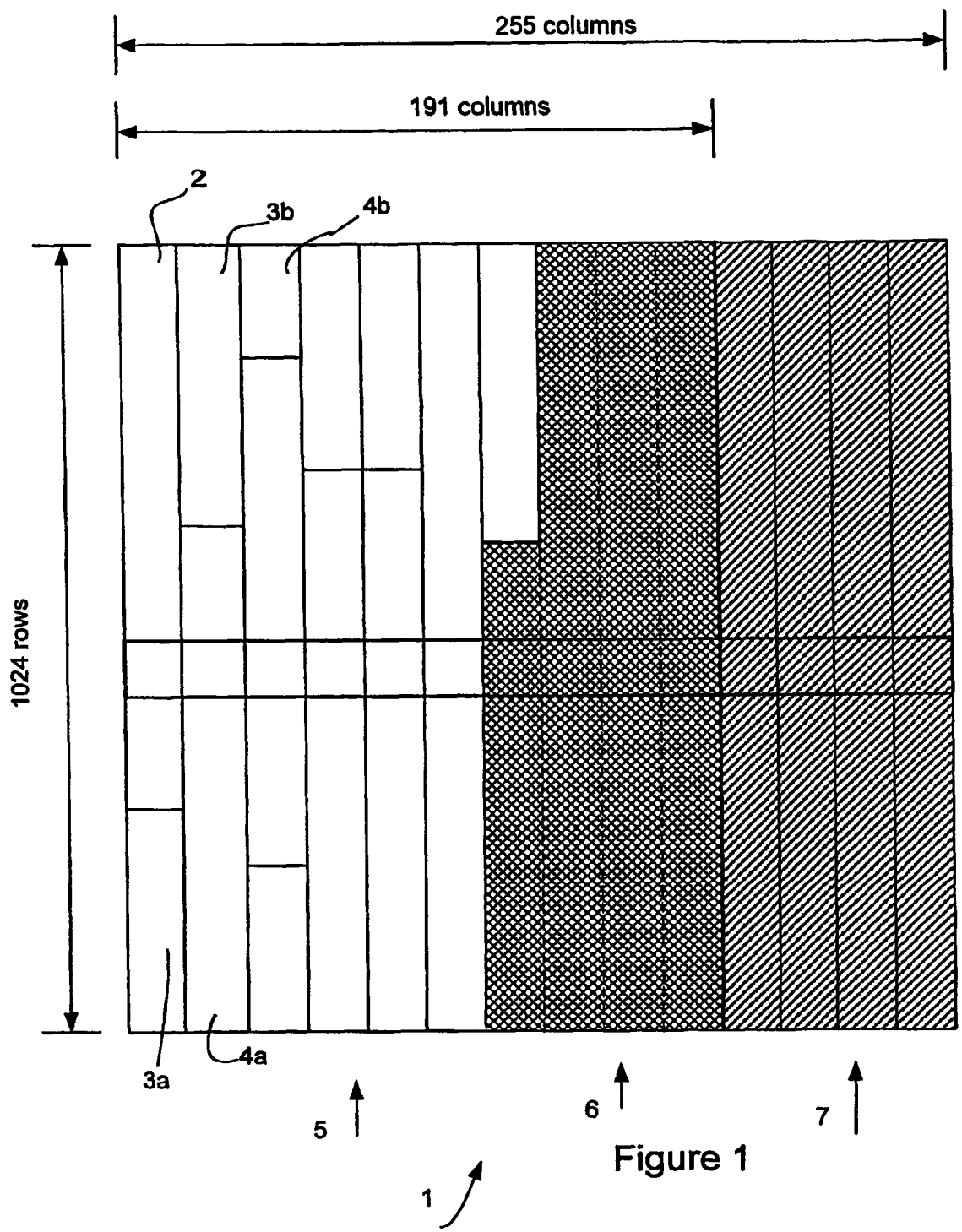
FIG. 1 is a schematic drawing of an exemplary coding array used to illustrate operation of FEC decoders and receivers.
Figure 2:
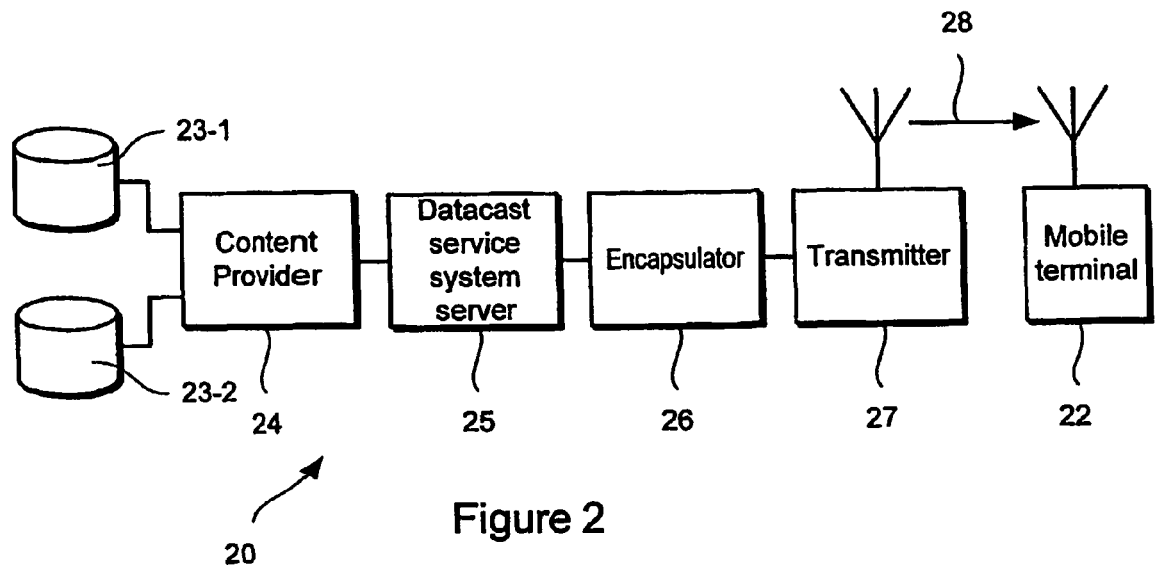
FIG. 2 shows an embodiment of a communication system in which the present invention may operate.

Referring to FIG. 2, a communications network 20 for delivering content to a mobile terminal 22 is shown. The communications network 20 includes a terrestrial digital video broadcasting (DVB-T) or a DVB-H network, which is used as a broadcast access network to deliver content for an Internet Protocol Data Casting (IPDC) service. However, other digital broadcast networks may be used including other types of DVB networks, such as a cable DVB network (DVB-C) or satellite DVB (DVB-S) network, a Digital Audio Broadcasting (DAB) network, an Advanced Television System Committee (ATSC) network or an Integrated Services Digital Broadcasting (ISDB) network.

The communications network 20 includes sources 23-1, 23-2 of content, for example in the form of video, audio and data files, a content provider 24 for retrieving, re-formatting and storing content, a datacast service system server 25 for determining service composition, an Internet-protocol (IP) encapsulator (IPE) 26 and a transmitter 27 for modulating and broadcasting a signal 28 to receivers (not shown) including a mobile terminal 22.

Figure 3:
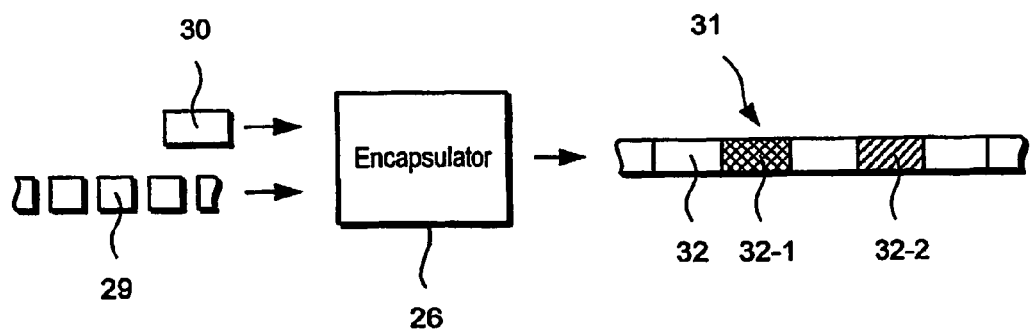
FIG. 3 shows an embodiment of a multiprotocol encapsulation (MPE) encapsulator forming part of the FIG. 2 system.

Referring to FIG. 3, the IP encapsulator 26 receives one or more streams of data 29 and service data 30 and generates therefrom MPEG program specific information (PSI) and DVB service information (SI), for inclusion in a transport stream 31 comprising MPEG-2 transport stream (TS) packets 32, typically 188 bytes long, according to International Organisation for Standards/International Electrotechnical Commission (ISO/IEC) Standard 13818-1 "Information Technology-Generic Coding of Moving Pictures and Associated Audio Information: Systems".

Figure 4:
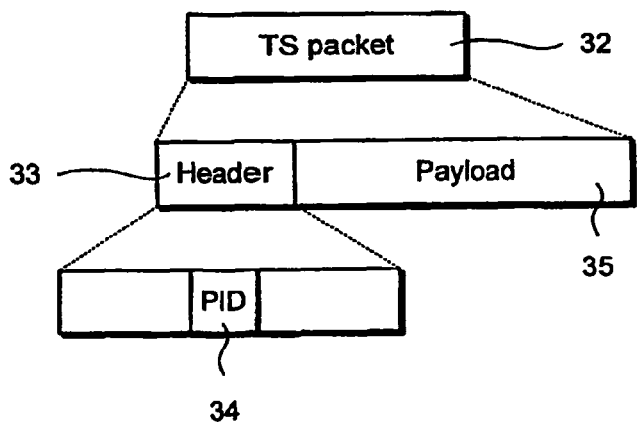
FIG. 4 illustrates an exemplary a transport stream packet.

Referring to FIG. 4, the transport stream 31 is divided into a number of logical channels, referred to as "elementary streams". The elementary stream to which a TS (transport stream) packet 32 belongs is defined in a packet header 33 using a packet identifier (PID) 34. The packet identifier 34 can be used to identify contents of a TS packet payload 35.

For example, the contents of a first TS packet 32-1 may be identified as containing all or part of a network information table (NIT) by specifying PID=0x0010 (as a hexadecimal number). The contents of a second TS packet 32-2 may be identified as being video, audio or another type of data by specifying a PID value between 0x0030 to 0x1FFE (hexadecimal).

Referring again to FIG. 2, the DVB transmitter 27 receives a signal from the encapsulator 26 which it modulates, amplifies and broadcasts.

Other network elements may be provided, such as a multiplexer (not shown) for combining a plurality of services (although an IPE can provide plural services), and a gap-filler transmitter for receiving and re-transmitting the signal 28. Furthermore, another communications network (not shown), such as a public land mobile network, preferably in the form a 2nd or 3rd generation mobile network such as GSM or UMTS respectively, may be provided for providing a return channel from the mobile terminal 20 to the communications network 21. A further communications network (not shown), such as the Internet, may be provided to connect distributed elements of the communications network 21, such as the content provider 24 and the service system server 25.

The IP encapsulator 26 generates forward error correction (FEC) data packets and assembles them into bursts comprising application data, and multiplexes transport stream packets into a single transport stream. The IP encapsulator may be implemented in software and/or hardware.

Figure 5:
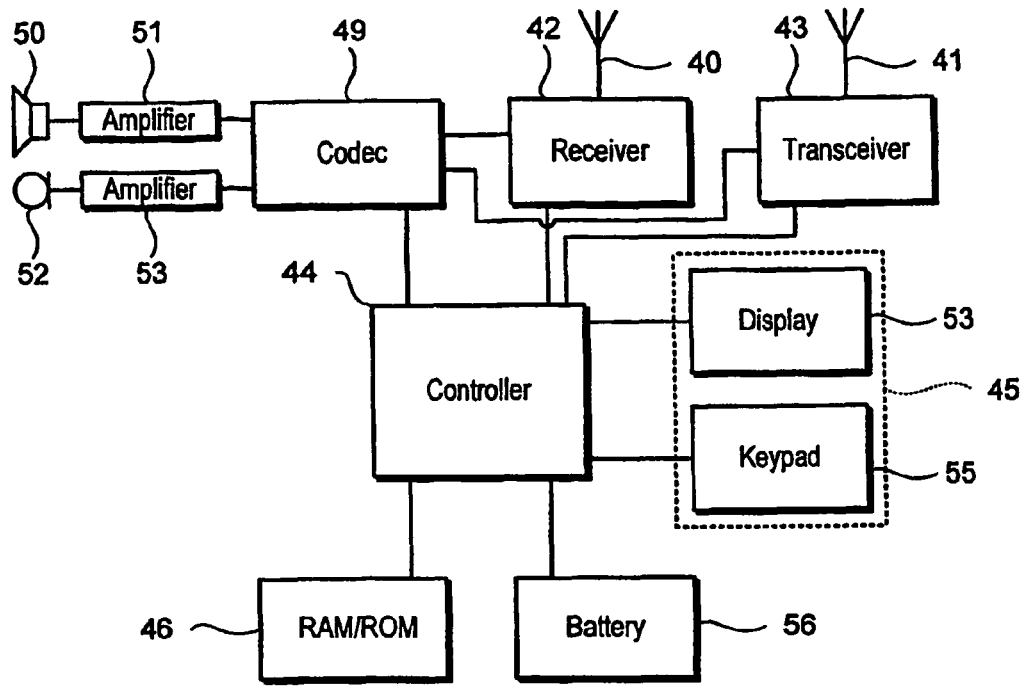
FIG. 5 illustrates schematically a mobile terminal included in the FIG. 1 system and implementing one embodiment of the invention.

Referring to FIG. 5, one embodiment of the mobile terminal 20 is shown schematically in the form of a combined mobile telephone handset and DVB-T receiver.

The mobile terminal 20 includes first and second antennas 40,41, a DVB-T receiver 42 and a mobile telephone transceiver 43. The receiver 42 and the transceiver 43 each include RF signal processing circuits (not shown) for amplifying and demodulating received signals and one or more processors (not shown) for channel decoding and demultiplexing.

The mobile terminal 20 also includes a controller 44, a user interface 45, one or more memories 46, a coder/decoder (codec) 49, a speaker 50 with corresponding amplifier 51 and a microphone 52 with a corresponding pre-amplifier 53.

The user interface 45 comprises a display 53 and a keypad 55. The display 53 is adapted for displaying images and video by, for instance, being larger and/or having greater resolution than a display of conventional mobile telephone and being capable of colour images. The mobile terminal 20 also includes a power source in the form of e.g. a rechargeable battery 56, to provide DC power.

The controller 44 manages operation of the mobile terminal 20 under the direction of software (not shown) stored in one of the memories 46. The controller 44 provides output signals for the display 53 and receives and processes inputs from the keypad 55.

The mobile terminal 20 may be modified by providing a single receiver adapted to receive signals from the DVB-T network 21 and the mobile telephone network and a transmitter adapted to transmit signals on the mobile telephone network (not shown). Alternatively, a single transceiver for both communications networks may be provided.

Figure 6:
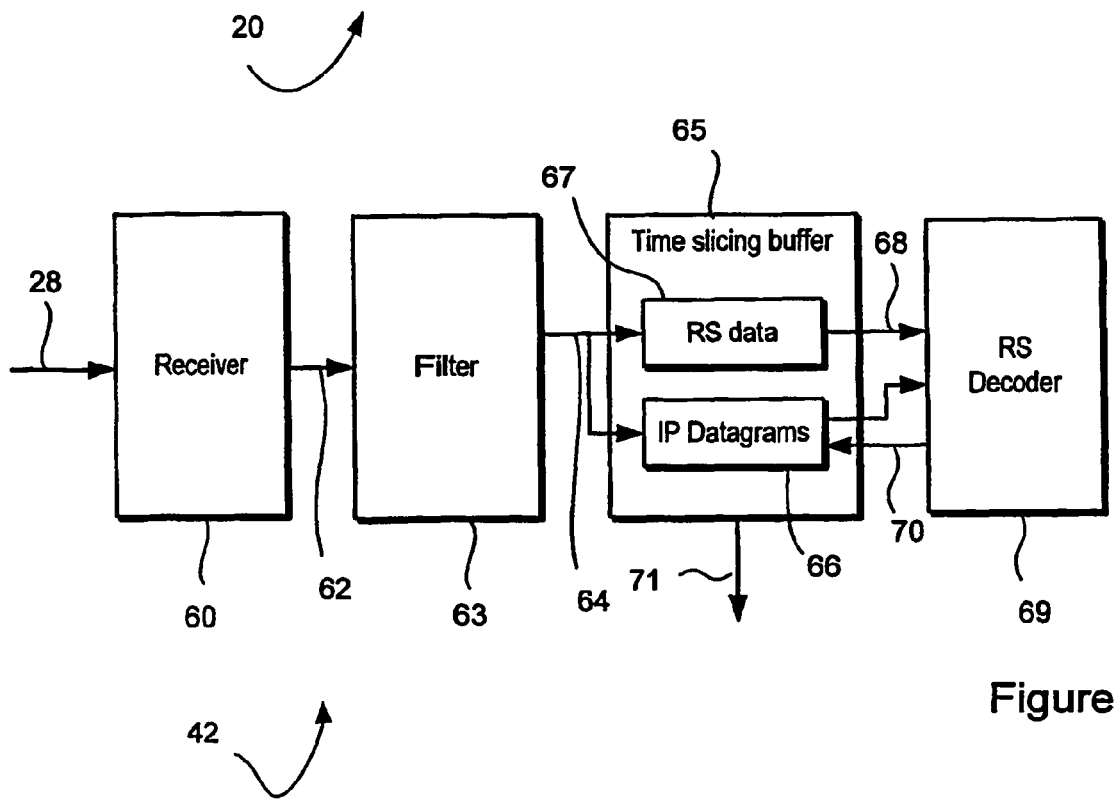
FIG. 6 shows operation of certain parts of the FIG. 5 mobile terminal, including a decoder according to one embodiment of the invention.

Referring to FIG. 6, part of the DVB-T receiver 42, is shown in more detail. The receiver 42 is intermittently switched on to receive the time-sliced signal 28 from the first communications network 21. The signal 28 is amplified, demodulated, channel decoded and demultiplexed into transport streams by an RF receiver 60. The elementary streams include TS packets carrying application data bursts.

An output 62 of the RF receiver 60 is connected to a filter 63, which has an IP datagram output 64 connected to a time-slicing buffer 65. The time slicing buffer 65 includes an IP datagram buffer portion 66 and an RS data buffer portion 67, and both are connected to the output of the filter 63. The time slicing buffer 65 has outputs connected from the IP datagram buffer portion 66 and the RS data buffer portion to inputs of a RS decoder 69, which provides data on an output 70 to an input of the IP datagram buffer portion 66 of the time slicing buffer 65. The time slicing buffet 65 also has an output 71, which constitutes an output of the receiver 42.

The receiver 60 provides at its output 62 TS packets. The filter 63 selects the desired TS packets and forms MPE and MPE-FEC sections from them. The payload of the MPE section (IP datagrams in this case) is extracted by the filter 63, and provided via the output 64 to the appropriate ones of the IP datagram buffer section 66 and the RS data buffer portion 67 of the time slicing buffer 65 for storage. The data is stored in table form. The IP datagrams are applied to the RS decoder 69, which decodes the data The address of the original location of each IP datagram is found from real time parameters transmitted in the MPE section header. Each row of data is sent from the table in the time slicing buffer 65 to the RS decoder 69, and the results of the decoding written back to the table via the output 70. Therefore the output of the time slicing buffer 65, which constitutes the output of the receiver 42, consists of RS decoded IP datagrams from the table.

Figure 7:
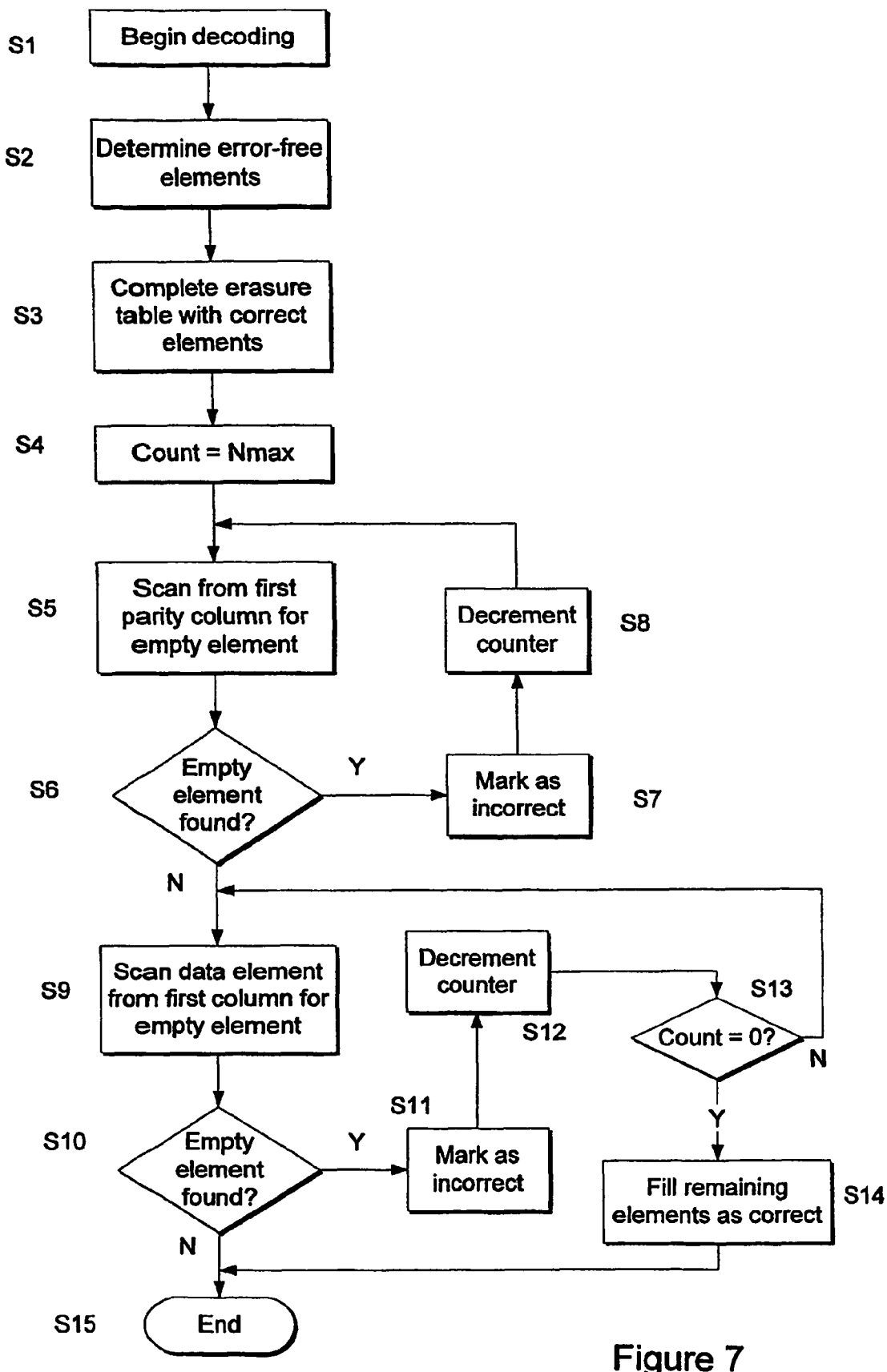
FIG. 7 is a flow diagram which illustrates operation of the decoder included in FIG. 6.

Operation of the decoder 69 of the FIGS. 5 and 6 of the mobile terminal will now be described with reference to FIGS. 7 to 13. Referring to FIG. 7, operation begins at step S1 where it is determined if a coding table is ready for decoding. The controller (not shown) of the decoder 69 determines which elements of the coding table are error-free at step S2, in any suitable manner. This error information can be obtained for example from a CRC check, which can be calculated for the MPE packets or at a DVB-T level RS decoder. At step S3, for each of the error-free element a corresponding element in an erasure information table is completed with a zero, thereby indicating which elements in the coding array are correct. There can be separate location in memory for the erasure information table, or alternatively the data memory can be extended from 8 bits/byte to 9 bits/byte memory with the additional bit being used for erasure info. The operation of FIG. 7 is carried out in one embodiment of the invention on a row-by-row basis, and the processing of one row is illustrated in FIGS. 8 to 13.

Figures 8, 9:
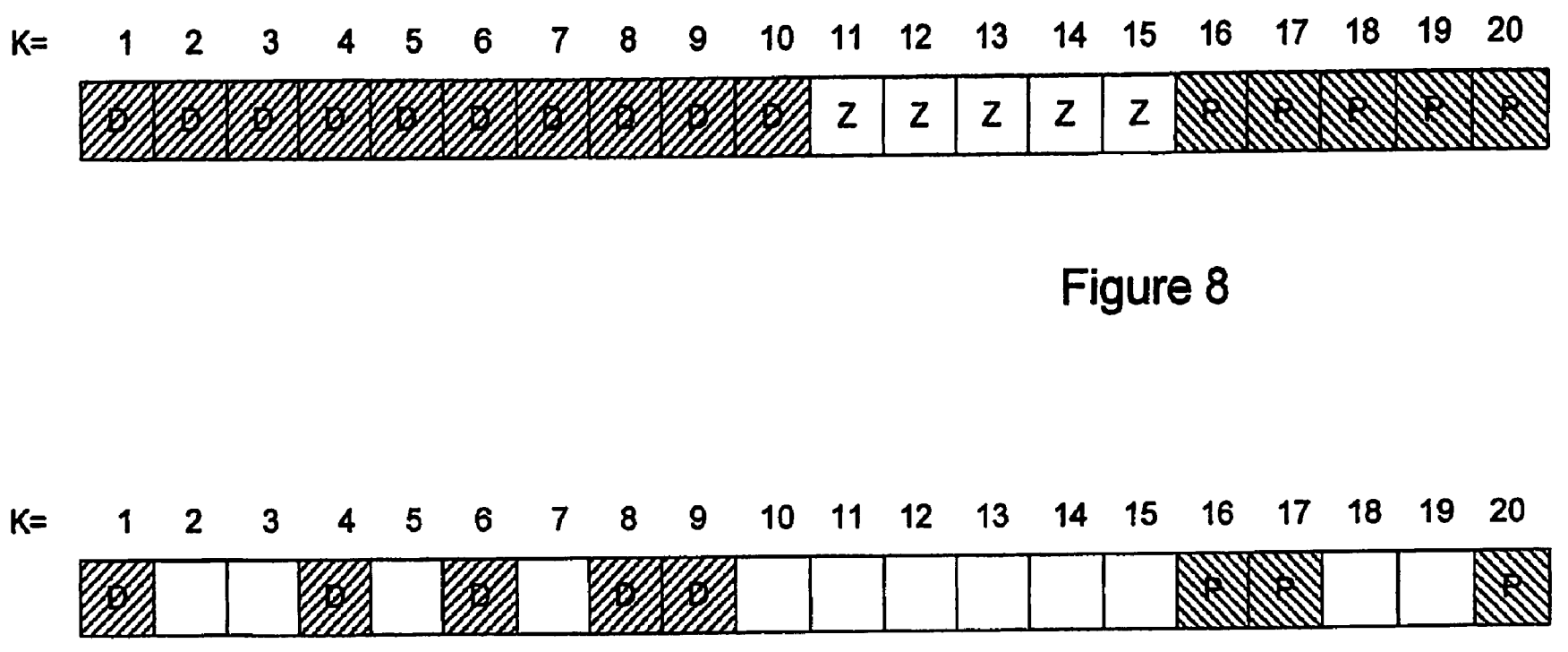

FIG. 8 shows as a simplified example one row of the coding array. In the illustrated example this row includes 20 elements, by which the invention can be understood. However, it would be appreciated that in one embodiment of the invention the row of the coding array may include up to 255 columns, since the decoder 69 is a RS (255,191) for which the maximum number of columns of application data elements is 191 and the number of columns of parity data elements is 64. In this example, the elements numbered K=1 to K=10 are application data elements (D), the elements K=11 to K=15 are zero padding elements (Z) and the elements K=16 to K=20 are parity data elements (P). Of course, the number of parity data elements in a row is predetermined, so it is known by the receiver prior to decoding. In this example at step S2 of FIG. 7 it is determined that five application data elements are error-free and that three parity data elements are error-free. These are illustrated in FIG. 9, from which it will be seen that elements K=1, 4, 6, 8, 9, 16, 17 and 20 are error-free elements. Since there is no data in the zero padding elements and because the starting location of the zero padding is assumed to be unknown, step S2 cannot determine them to be error-free. Using this, step S3 creates a row of the corresponding erasure table with data indicating the error-free elements. Thus, from FIG. 10, in which the row of the coding table is shown above the corresponding row of the erasure table, it can be seen that zeros are included in the row of the erasure information table at K=1, 4, 6, 8, 9, 16, 17 and 20.

Figures 10, 11:
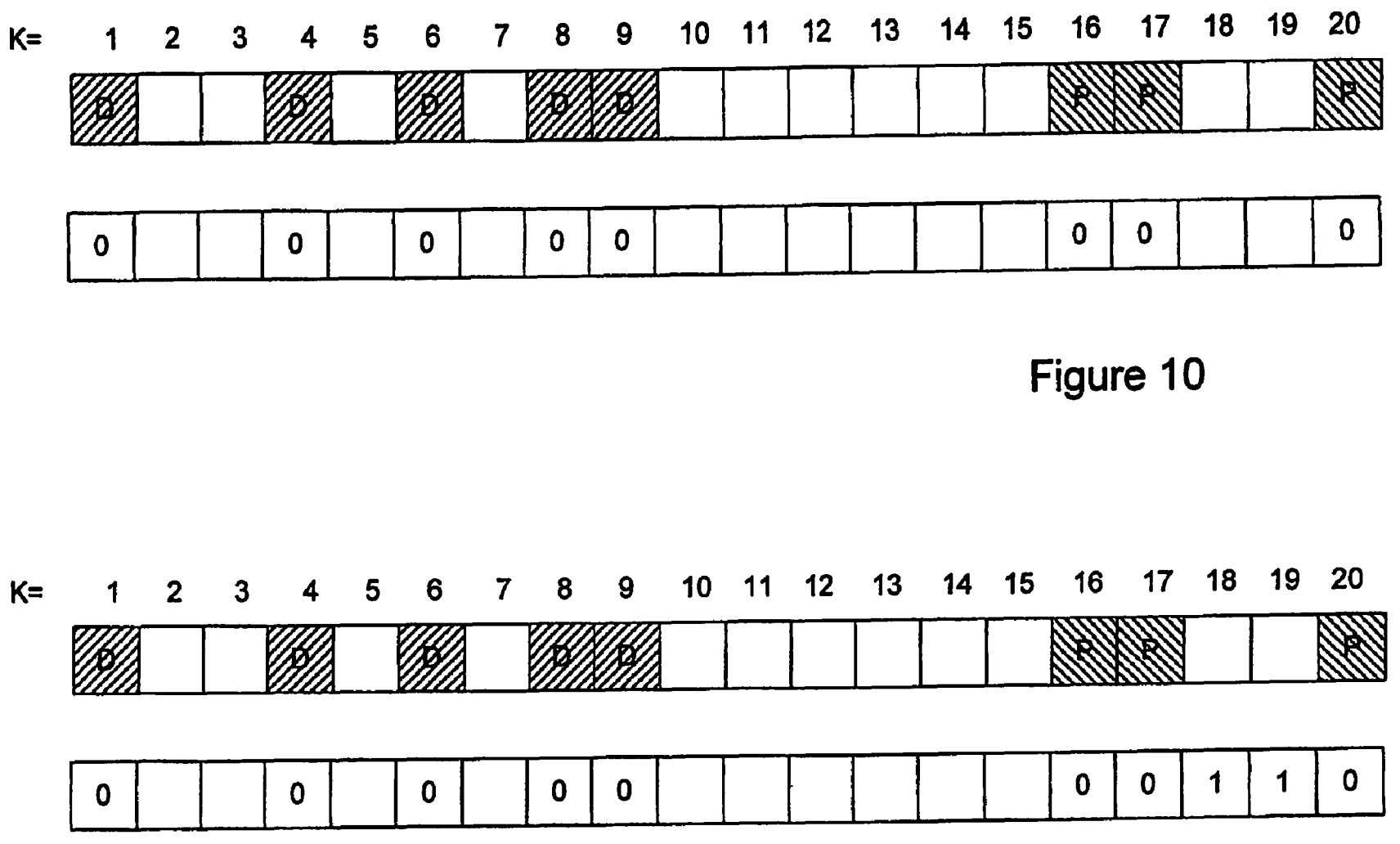

Referring again to FIG. 7, a counter is initialised to Nmax at step S4. In one embodiment of the invention where the coding array 1 has 255 columns and a Reed Solomon algorithm is used, Nmax is equal to 64. Generally, Nmax is equal to the number of correctable elements in the row of the coding table. In this simple illustration, though, Nmax is set equal to 10. At step S5, the row of the erasure information table is scanned beginning from the first parity column (in this example K=16) for empty elements, i.e. elements, which are not marked correct or incorrect. In this example, an empty element is found at K=18, so step S6 provides a "yes" result. Following this, the empty element of the erasure information table row is marked as incorrect at step S7 by filling it with a "1". The counter is then decremented at step S8 before the procedure returns again to step S5. Step S6 determines if an empty element is found. In this example, step S6 will then determine that the erasure information row is empty at K=19, so this element will be marked as incorrect at step S7 and the counter decremented again at step S8. After that, step S6 will return a negative result since there are no empty elements left in the parity columns. Following a negative result at step S6, the erasure information table row appears as shown in FIG. 11, which shows the coding row and erasure row as in FIG. 10. The same applies to FIGS. 12 and 13. In this manner (steps S5 to S8) all parity elements are searched for empty elements. When all parity elements have been checked, and all empty elements marked, the process continues at step S9.

At step S9, the elements of the erasure information table row corresponding to application data and zero padding are scanned for empty elements starting from the element corresponding to the first column of the application data and including zero padding. In this example, an empty element appears at K=2, so a positive result is returned from step S10. At step S11, this empty element is marked as incorrect by filling it with a "1". At step S12, the counter is then decremented. Following this, it is determined at step S13 whether or not the counter is equal to zero, which would indicate that all of the correctable errors have been found. If the counter is not zero, the operation proceeds again to step S9, which will be the case at this point in the example shown. Then, step S10 will determine that an empty element is found at K=3, which will then be marked as incorrect at step S11 before the counter is decremented at step S12.

Following all of the elements in the erasure information table row which correspond to application data which contains errors being marked as such, steps S9, S10 and S11 will result in elements which correspond to zero padding being marked as incorrect. This occurs until step S10 returns that there are no empty elements remaining in the erasure information table row or until step 13 determines that the count is zero. Following step S10 determining that there are no empty elements, the operation proceeds to end at step S15. In this example though, following step S11 marking zero padding element K=10 as incorrect, step S12 will decrement the counter to zero, so step S13 will return a positive result and the operation will proceed to step S14, where all the remaining empty elements are filled with "0". The erasure information row which results at this point is illustrated in FIG. 12. Here it can be seen that as well as all of the parity data and application data elements which were incorrectly received being marked as such, some of the zero padding data elements are also indicated as being incorrect. However, since the number of allowed errors has not been exceeded, this is not a problem for the decoder since all of the errors in the application data and parity data can be corrected. This procedure is repeated for every row in the erasure data table.

Another example will now be described. In this example, the same elements of the coding array row are correctly received, but the counter Nmax is instead set to six, i.e., only six errors are allowed before the decoder cannot properly correct the errors. In this example, the operation is exactly the same as that described up to step S6 returning that there are no more empty elements in the parity columns. Then, step S9 causes the erasure information row to be scanned from element K=1 for an empty element, which step S10 then reveals is found at K=2. This element is marked as incorrect at step S11 before the counter is decremented at step S12. Since the counter has not been decremented to zero, step S13 returns a negative result so the operation proceeds again to step S9. After the elements K=2, 3, 5 and 7 are marked as incorrect by operation of steps S9 to S11, the counter has been decremented to 1. Following the decrementing of the counter at step S12, step S13 then determines that the counter is equal to zero, so the operation proceeds to step S14. Here, the decoder operates to fill remaining empty elements in the erasure information row as error-free, by including a "0" in each of the empty elements K=10 to K=15. One of these elements K=10, is actually an incorrectly received application data element, although it is marked as being correctly received. However, this was unavoidable since the number of incorrectly received application data and parity data elements exceeds the maximum number which is permitted if the error is to be corrected. As a result, the decoder can not correct any elements in the row but just outputs the same erroneous row and gives an indication of uncorrected error.

In one embodiment of the invention, the erasure info table is initialised before it is used by pre-writing either "0" or "1" into each element of the table. This can reduce the number of memory accesses needed to complete the erasure information row, because only those elements that have different value than the initial value need to be re-written into the table. For instance, if the table is initialised with zeros, only the elements with ones must be written into the table. If the table is not initialised in this way, all the elements must be written into the table. Whether the row is pre-filled with "0"s or "1"s may depend on the number of error-free elements. If most of the elements are error-free, then the erasure table may best be initialised with "0"s.

It will be appreciated that many modifications may be made to the embodiments hereinbefore described. For example, the mobile terminal may be a personal data assistant (PDA) or other mobile terminal capable of at least of receiving signals via the first communications network 21. The mobile terminal may also be semi-fixed or semi-portable such as a terminal carried in vehicle, such as a car. Moreover, the invention has application in any forward error correct system, not just that described in the embodiment, and is applicable to rows of different lengths.

Also, the case of '1's to indicate incorrect data and '0's to indicate correct data is not important, since it is easy to use the opposite meanings.

Furthermore, the location of the parity data elements in a row is not critical. Instead of being at the end of the rows, they could be at the beginning or somewhere in the middle. It is important to know only where they are and in which direction the rows are filled with application data and zero padding.

Still further, although the processing has been described in respect of rows of a coding table, the table may be replaced by discrete 'words' which, if brought together, could form a coding table.

Still further instead of setting the counter to Nmax and decrementing it, the counter may start from zero and be incremented. Here, instead of testing for a counter value of zero, the test is for a counter value of Nmax.

The invention claimed is:

1. A method of operating a forward error correction decoder, the method comprising:
   determining which data elements in a code word including parity data elements are error-free;
   marking elements in an erasure information word which correspond to error-free data elements as correct;
   maintaining a count of elements marked as correctable in the erasure information word; and
   whilst the count of elements marked as correctable has not exceeded a threshold and whilst elements not marked as correct or correctable remain in the erasure information word, marking non-marked elements of the erasure information word as correctable beginning with elements corresponding to parity data elements and then continuing for the other elements in the erasure information word.

2. A method as claimed in claim 1, further comprising indicating the presence of uncorrected data at an output.

3. A method as claimed in claim 1, in which the code word is a row of a coding table.

4. A method as claimed in claim 1, in which the decoder is a Reed Solomon decoder.

5. A forward error correction decoder, comprising one or more processors arranged to:
   determine which data elements in a code word including parity data elements are error-free;
   mark elements in an erasure information word which correspond to error-free data elements as correct;
   maintain a count of elements marked as correctable in the erasure information word; and mark, whilst the count of elements marked as correctable has not exceeded a threshold and whilst elements not marked as correct or correctable remain in the erasure information word, non-marked elements of the erasure information word as correctable beginning with elements corresponding to parity data elements and then continuing for the other elements in the erasure information.

6. A decoder as claimed in claim 5, in which the one or processors is further arranged to indicate the presence of uncorrected data at a decoder output.

7. A decoder as claimed in claim 5, in which the code word is a row of a coding table.

8. A decoder as claimed in claim 5, implemented as a Reed Solomon decoder.

9. A decoder as claimed in claim 5, in which the decoder has 255 element columns, 191 of which are non-parity data element columns.

10. A receiver including a forward error correction decoder as claimed in claims 5.

11. A receiver as claimed in claim 10, implemented as a digital video broadcasting receiver.

12. A mobile terminal including a receiver as claimed in claim 10.

* * * * *